United States Patent [19]

Kawamma et al.

[11] Patent Number: 4,837,128

[45] Date of Patent: Jun. 6, 1989

[54] LIGHT-SENSITIVE COMPOSITION

[75] Inventors: Kouichi Kawamura; Yukio Abe; Tatsuji Higashi; Yoshimasa Aotani, all of Shizuoka, Japan

[73] Assignee: Fuji Photo Film Co., Ltd., Minami-Ashigara, Japan

[21] Appl. No.: 79,137

[22] Filed: Jul. 29, 1987

[30] Foreign Application Priority Data

Aug. 8, 1986 [JP] Japan .................................. 61-186238
Sep. 26, 1986 [JP] Japan .................................. 61-227489

[51] Int. Cl.$^4$ .......................... G03C 1/68; G03C 1/60; G03C 1/727; C07D 251/20
[52] U.S. Cl. .................................... 430/281; 430/920; 430/916; 522/52; 522/63
[58] Field of Search .................. 430/920, 281, 285; 522/16, 52, 63

[56] References Cited

U.S. PATENT DOCUMENTS 4,239,850 12/1980 Kita ...................................... 430/281
4,399,211 8/1983 Kondo et al. ......................... 430/269
4,619,998 10/1986 Buhr ................................. 544/193.1

FOREIGN PATENT DOCUMENTS 1602903 11/1981 United Kingdom .

OTHER PUBLICATIONS

Chemical Abstract vol. 76, No. 21, Abstract No. 126945z, 1972.
Chemical Abstract vol. 78 (21), Abstract No. 136233w, 1973.

*Primary Examiner*—Paul R. Michl
*Assistant Examiner*—Thorl Chea

*Attorney, Agent, or Firm*—Burns, Doane, Swecker & Mathis

[57] ABSTRACT

A light-sensitive composition is herein disclosed, which comprises at least one light-sensitive s-triazine compound represented by the following general formula (I) and at least one compound having at least one ethylenically unsaturated double bond and capable of causing addition polymerization:

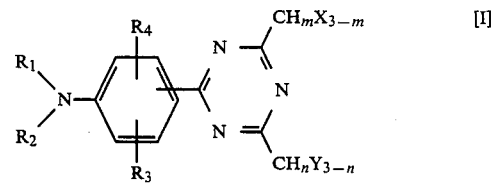

wherein $R_1$ and $R_2$ independently represent hdyrogen atom, a substituted or unsubstituted alkyl or aryl group, or a group represented by the general formula: $R_5$—CO— or $N(R_6)(R_7)$—CO— (wherein $R_5$ stands for a substituted or unsubstituted alkyl or aryl group; and $R_6$ and $R_7$ independently represent hydrogen atom or a substituted or unsubstituted alkyl or aryl group), provided that $R_1$ and $R_2$ may form a heterocyclic ring consisting of non-metallic atoms together with the nitrogen atom to which they are bonded; $R_3$ and $R_4$ represent hydrogen, a halogen, an alkyl or an alkoxyl; X and Y independently represent chlorine or bromine; and m and n are 0, 1 or 2. The light-sensitive composition has high sensitivity even after storing at a high temperature and effectively used for producing light-sensitive plates for making lithographic printing plates; proof plates for printing; films for overhead projector, intermediate print and photomasks; and photoresists.

18 Claims, No Drawings

LIGHT-SENSITIVE COMPOSITION

BACKGROUND OF THE INVENTION

1. Field of the Invention

The present invention relates to a novel light-sensitive composition containing a compound capable of forming free radicals by irradiating with light and more particularly to a novel light-sensitive composition containing a light-sensitive s-triazine compound.

2. Description of the Prior Art

Compounds which are decomposed by the irradiation with light and thus form free radicals (free radical generator) have been well known in the field of graphic arts. They have widely been used as a photopolymerization initiator in a photopolymerizable composition, a photoactivator in a free radical photographic composition and a photoinitiator for a reaction which is catalized with an acid formed by irradiating a component with light. With using such a free radical generator, it is possible to form a variety of light-sensitive materials which are useful in the image-forming systems such as printing, duplication, copy or the like.

Organic halide compounds are photolytically dissociated to provide free radicals of halogen such as chlorine free radicals and bromine free radicals. These halogen free radicals act as a good hydrogen atom-extracting agent and form an acid if a hydrogen donnor is present. As to the application of these organic halogen compounds to photopolymerization processes and free radical photographic processes, reference is made to—Light Sensitive Systems—, by J. Kosar, 1965, pp. 180–181 and 361–370, J. Wiley & Sons (New York).

Typical examples of such compounds capable of forming halogen free radicals by the action of light includes carbon tetrabromide, iodoform and tribromoacetophenone and they have widely been used. However, these free radical generators suffer from a drawback that they are decomposed only by light having a wave length of a quite narrow range. In other words, they are sensitive to light in the ultraviolet region having a wave length shorter than the principal wave length of light sources commonly utilized. The organic halogen compounds conventionally used are thus inferior in the capability of generating free radicals since they cannot effectively be decomposed with light of from near ultraviolet to visible regions emitted from the light sources generally used.

In order to eliminate such a disdvantage, it has been proposed to extend the wave length range to which they are sensitive by admixing them with a certain sensitizer. For instance, as such sensitizer, U.S. Pat. Nos. 3,106,466 and 3,121,633 disclose merocyanine dyes, styryl bases and cyanine bases. The addition of such a sensitizer makes it possible to extend the wave length range, to which these organic halogen compounds are sensitive, to visible region, however, the sensitivity thereof is still insufficient in the practical point of view. In general, the sensitizer should be selected from those having a good compatibility with free radical generators and other components incorporated in the light-sensitive compositions. Nevertheless, it has generally been difficult to select sensitizers of good compatibility and high sensitivity.

Under such circumstances, halogen free radical generators, which are sensitive to near ultraviolet to visible regions, have been proposed. Examples of such generators include halomethyl-s-triazine compounds such as those disclosed in U.S. Pat. Nos. 3,954,475; 3,987,037 and 4,189,323. The wave length range sensitive to these compounds is between near ultraviolet and visible regions, however, they do not effectively utilize the light irradiated because of relatively low sensivety to photodecomposition. In addition, these triazine compounds cause crystallization in the light-sensitive compositions during long term storage which leads to the reduction in the sensitivity.

SUMMARY OF THE INVENTION

As seen from the foregoing descriptions, there has not yet been developed a light-sensitive composition having high sensitivity to photolysis and sensitive to light of near ultraviolet to visible regions.

Accordingly, it is a principal object of the present invention to provide a light-sensitive composition having high sensitivity and containing a free radical generator of high sensitivity to photolysis.

It is another object of the present invention to provide a light-sensitive composition having a good storage stability.

The inventors of the present invention have conducted various studies on light-sensitive compositions containing a free radical generator which is decomposed by the irradiation with light to form free radicals so as to eliminate the aforementioned drawbacks associated with the conventional ones and found that these drawbacks can effectively be eliminated by using a specific s-triazine compound as a free radical generating compound.

The foregoing and other objects according to the present invention can be accomplished by providing a light-sensitive composition comprising at least one light-sensitive s-triazine compound represented by the following general formula (I):

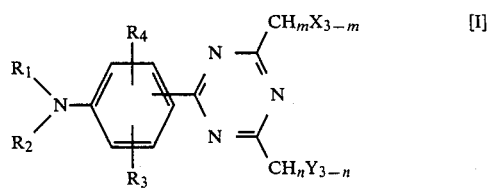

wherein $R_1$ and $R_2$, which may be the same or different, each represents hydrogen atom, an alkyl group, a substituted alkyl group, an aryl group, a substituted aryl group, or a group represented by the following general formula (II) or (III):

(wherein $R_5$ stands for an alkyl group, a substituted alkyl group, an aryl group or a substituted aryl group and $R_6$ and $R_7$, which may be the same or different, each represent hydrogen atom, a substituted or unsubstituted alkyl group or a substituted or unsubstituted aryl group); $R_3$ and $R_4$ denote hydrogen atom, a halogen atom, an alkyl group or an alkoxy group; X and Y, which may be the same or different, each represent chlorine atom or bromine atom; and m and n are an integer of 0, 1 or 2; provided that $R_1$ and $R_2$ may form a heterocyclic ring consisting of non-metallic atoms together with the nitrogen atom to which they are bonded, and at least one compound having at least one ethylenically unsaturated double bond capable of causing addition polymerization.

The compounds represented by the general formula (I) have a good compatibility with other components of the light-sensitive composition in contrast to the conventionally proposed sensitizers listed above.

PREFERRED EMBODIMENTS OF THE INVENTION

The light-sensitive composition according to the present invention will hereunder be explained in more detail.

In the substituents $R_1$ to $R_7$ appearing in the general formulas (I) to (III), preferred examples of the alkyl groups include those having 1 to 6 carbon atoms such as methyl group, ethyl group and iso-propyl group; and preferred examples of the aryl groups are those having 6 to 14 carbon atoms such as phenyl and naphthyl groups.

Moreover, examples of the substituents appearing in the substituted alkyl groups represented by $R_1$, $R_2$ and $R_5$ to $R_7$ include aryl groups such as phenyl group; halogen atoms such as chlorine atom; alkoxyl groups such as methoxy and ethoxy groups; carboxyl group; carboalkoxyl groups such as carbomethoxy and carboethoxy groups; carboaryloxy groups; cyano group; acyl groups such as acetyl group and benzoyl group; nitro group; dialkylamino groups; and groups derived from sulfonyl derivatives represented by the following general formulas (A) to (C):

(A)

(B)

(C)

wherein Z represents hydrogen atom, an alkyl group or an aryl group.

In addition, examples of the substituents appearing in the substituted aryl group represented by $R_1$, $R_2$ and $R_5$ to $R_7$ include alkyl groups in addition to the foregoing examples.

In the case where $R_1$ and $R_2$ form a heterocyclic ring consisting of non-metallic atoms together with the nitrogen atom to which these substituents are bonded, examples thereof are those represented by the following general formulas (D) to (H):

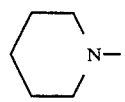

(D)

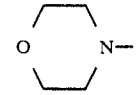

(E)

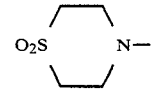

(F)

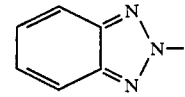

(G)

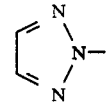

(H)

Particularly preferred examples of the substituents attached to the substituted alkyl group and substituted aryl group represented by $R_1$ and $R_2$ include electron attractive groups such as halogen atoms, carboxyl group, carboalkoxy groups, cyano group, acyl groups and groups derived from sulfonyl derivatives. In addition, particularly preferred examples of the substituents attached to the substituted alkyl group and substituted aryl group represented by $R_5$ are electron donative groups such as dialkylamino groups and alkoxy groups.

Among the compounds represented by the general formula (I), particularly preferred examples include those in which $R_1$ and $R_2$ represent hydrogen atom, carboalkoxymethyl groups, chloromethyl group, chloroethyl group, cyanomethyl group or cyanoethyl group, with proviso at least one of $R_1$ and $R_2$ represents a group other than hydrogen atom, or further $R_1$ and $R_2$ form a group represented by the following formula:

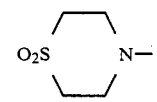

and in which $R_3$ and $R_4$ are hydrogen atom, a halogen atom or an alkyl group in the general formula (I).

The compounds represented by the general formula (I) and used in the light-sensitive composition according to the present invention can be prepared by cyclizing an aromatic nitrile compound represented by the following general formula (IV):

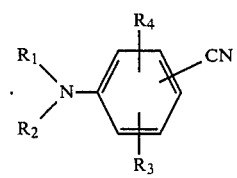

(IV)

(wherein $R_1$ to $R_4$ are the same as those defined in connection with the general formula (I)) and a haloacetonitrile according to the method disclosed in Bull. Chem. Soc. Japan, 1960, Vol. 24, pp. 2924–2930 by K. Wakabayashi et al.

Examples of the compounds useful as the free radical generator which can be used in the present invention will hereunder be illustrated, however, it is not intended to restrict the present invention to these specific examples.
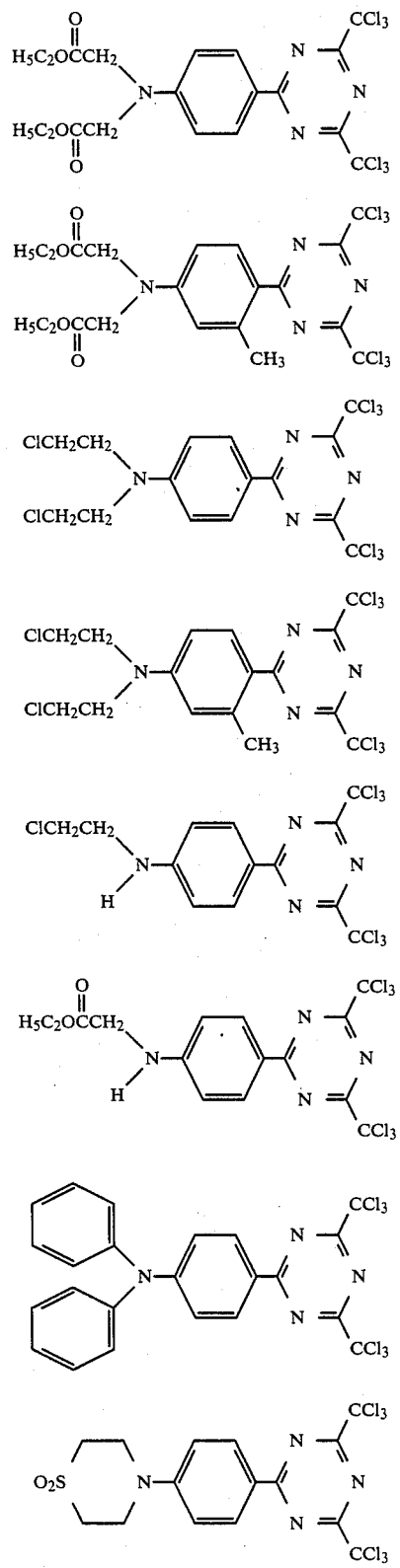
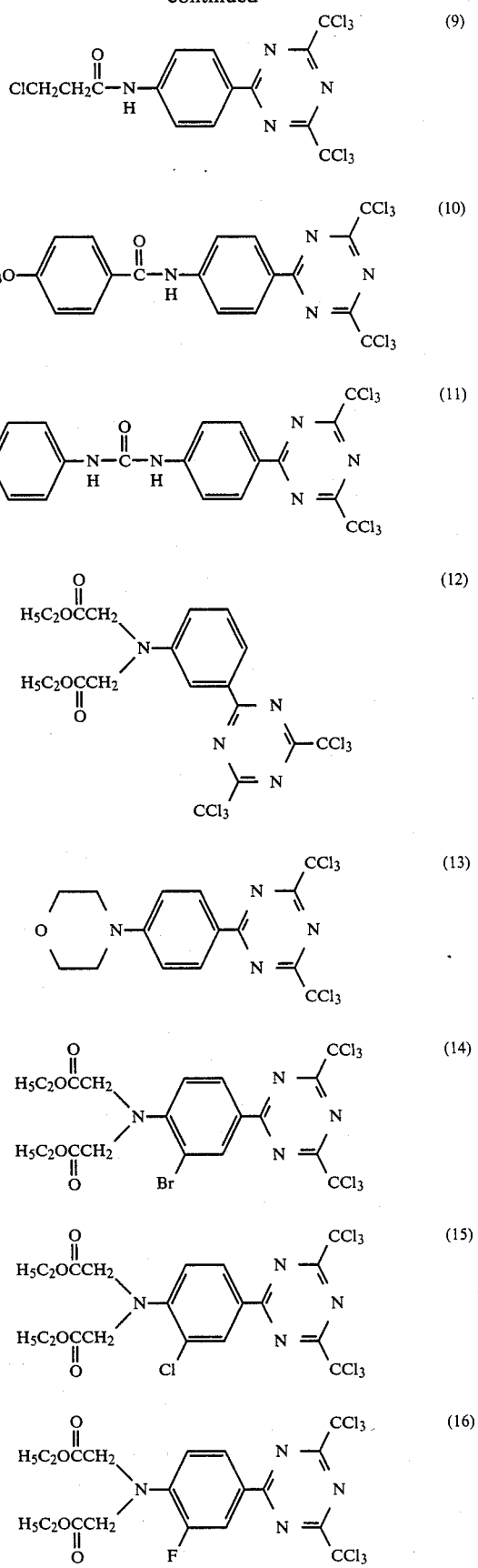

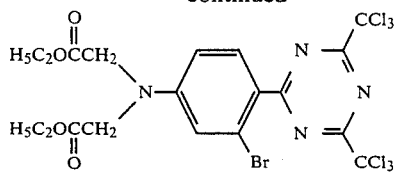 (17)
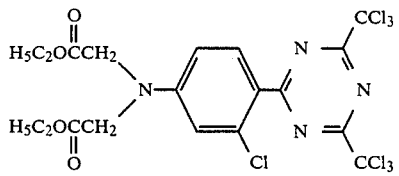 (18)
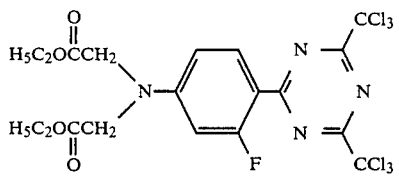 (19)
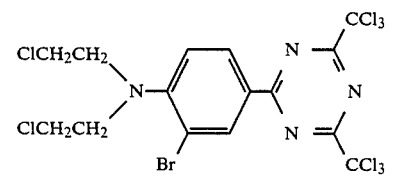 (20)
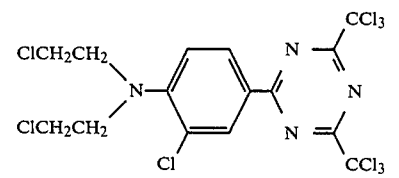 (21)
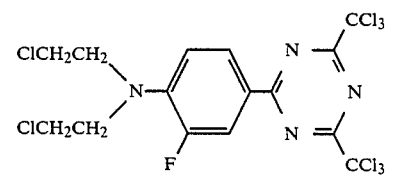 (22)
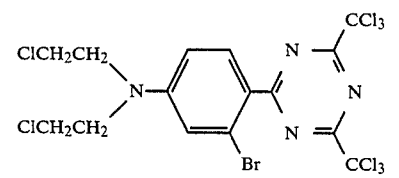 (23)
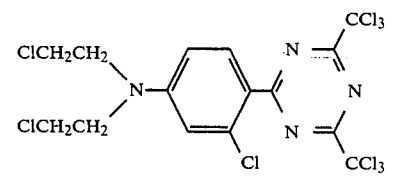 (24)
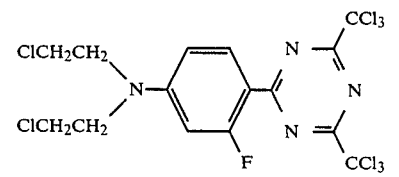 (25)
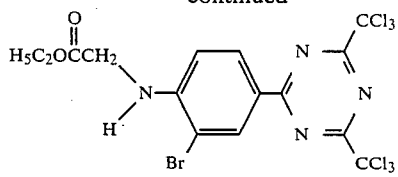 (26)
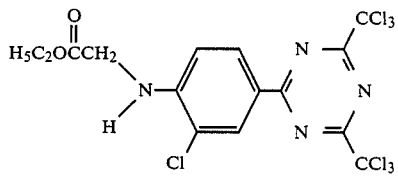 (27)
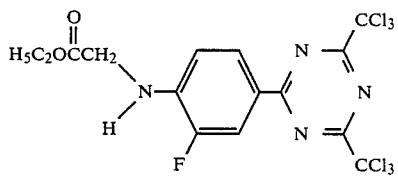 (28)
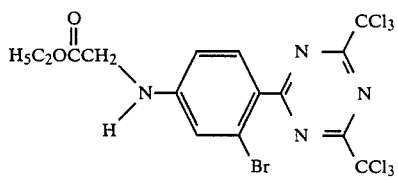 (29)
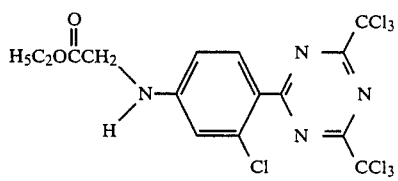 (30)
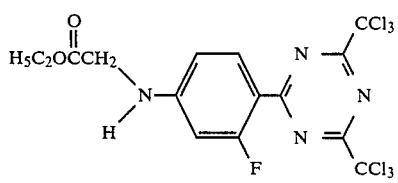 (31)
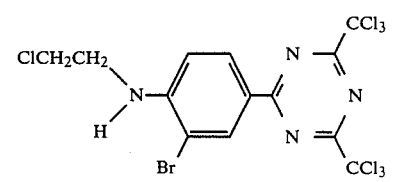 (32)
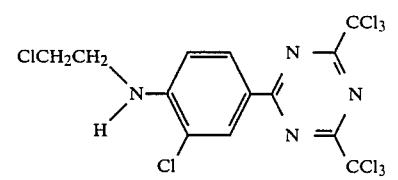 (33)
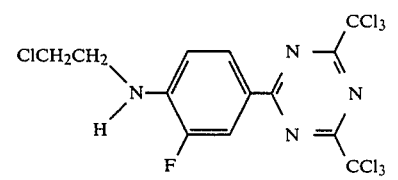 (34)

-continued

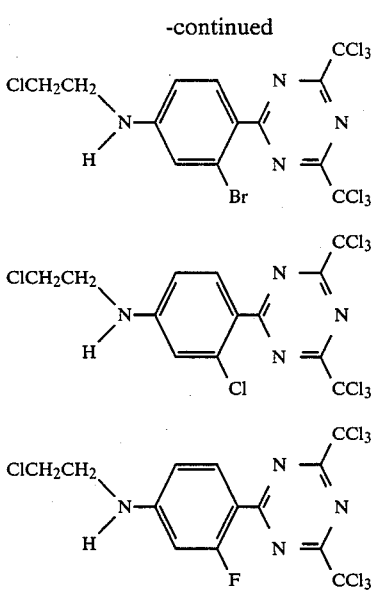

The free radical generators represented by the general formula (I) are particularly usefull as the photopolymerization initiator for photopolymerizable compositions.

The photopolymerizable composition are composed of a polymerizable compound having at least one ethylenically unsaturated double bond, and a photopolymerizable initiator, and if necessary a binder, and further optionally a sensitizer. The composition is particularly useful in preparing a light-sensitive layer of presensitized plate from which printing plates are to be prepared, a photoresists or the like.

The polymerizable compounds having at least one ethylenically unsaturated double bond as used in the photopolymerizable composition of the present invention mean those having at least one ethylenically unsaturated double bond in their chemical structures and are in the form of monomers, prepolymers, i.e., dimers, trimers and other oligomers as well as mixtures and copolymers thereof. Examples of the compounds include unsaturated carboxylic acids and salts thereof, esters of unsaturated carboxylic acids and aliphatic polyols, and amides of unsaturated carboxylic acids and aliphatic polyamines.

Examples of such unsaturated carboxylic acids are acrylic acid, methacrylic acid, itaconic acid, crotonic acid, iso-crotonic acid and maleic acid and examples of the salts thereof include alkali metal salts of the foregoing acids, such as sodium salts and potassium salts.

Examples of the esters of aliphatic polyols and unsaturated carboxylic acids are acrylates such as ethylene glycol diacrylate, triethylene glycol diacrylate, 1,3-butanediol diacrylate, tetramethylene glycol diacrylate, propylene glycol diacrylate, trimethylolpropane triacrylate, trimethylolethane triacrylate, 1,4-cyclohexanediol diacrylate, tetraethylene glycol diacrylate, pentaerythritol diacrylate, pentaerythritol triacrylate, pentaerythritol tetraacrylate, dipentaerythritol diacrylate, dipentaerythritol triacrylate, dipentaerythritol tetraacrylate, dipentaerythritol hexaacrylate, sorbitol triacrylate, sorbitol tetraacrylate, sorbitol pentaacrylate, sorbitol hexaacrylate and acrylic polyester oligomer; methacrylates such as tetramethylene glycol dimethacrylate, triethylene glycol dimethacrylate, trimethylolpropane trimethacrylate, trimethylolethane trimethacrylate, ethylene glycol dimethacrylate, 1,3-butanediol dimethacrylate, pentaerythritol dimethacrylate, pentaerythritol trimethacrylate, dipentaerythritol dimethacrylate, sorbitol trimethacrylate, sorbitol tetramethacrylate, bis(p-(3-methacryloxy-2-hydroxypropoxy)-phenyl)dimethylmethane, bis-(p-methacryloxyethoxy)-phenyl)dimethylmethane; itaconates such as ethylene glycol diitaconate, propylene glycol diitaconate, 1,3-butanediol diitaconate, 1,4-butanediol diitaconate, tetramethylene glycol diitaconate, pentaerythritol diitaconate and sorbitol tetraitaconate; crotonates such as ethylene glycol dicrotonate, tetramethylene glycol dicrotonate, pentaerythritol dicrotonate and sorbitol tetracrotonate; isocrotonates such as ethylene glycol diisocrotonate, pentaerythritol diisocrotonate, and sorbitol tetraisocrotonate; maleates such as ethylene glycol dimaleate, triethylene glycol dimaleate, pentaerythritol dimaleate and sorbitol tetramaleate; and mixtures of the foregoing esters.

Examples of the amides of aliphatic polyamine compounds and unsaturated carboxylic acids include methylene-bis-acrylamide, methylene-bis-methacrylamide, 1,6-hexamethylene-bis-acrylamide, 1,6-hexamethylene-bis-methacrylamide, diethylenetriamine-tris-acrylamide, xylylene-bis-acrylamide and xylylene-bis-methacrylamide.

Other examples thereof include vinyl urethane compounds each containing at least two polymerizable vinyl groups per molecule obtained by addition reaction of a vinyl monomer having hydroxyl groups and represented by the following general formula (V) described below to a polyisocyanate compound having at least two isocyanate groups in a molecule as disclosed in Japanese Patent Publication No. 48-41708.

$$CH_2=C(R)COOCH_2CH(R')OH \qquad (V)$$

wherein R and R' each represent hydrogen atom or methyl group.

According to the photopolymerizable composition of the present invention in which the free radical generators represented by the general formula (I) are used as the photopolymerization initiator, the photopolymerizable composition may optionally contain a binder.

Such binders which may be incorporated in the composition of the present invention should have a good compatibility with the polymerizable ethylenically unsaturated compounds and the photopolymerization initiators to the extent that they never cause separation during all of the processes for manufacturing light-sensitive materials inclusive of the preparation of a coating liquid of the composition, coating process and drying process and should be able to be subjected to development processing irrespective of the development being dissolution-development or swelling-development as a light-sensitive layer or a resist layer as well as they should be a material which can form a tough film as a light-sensitive layer or a resist layer. In general, they are properly selected among linear organic high molecular polymers.

Concrete examples of the binders include chlorinated polyethylene, chlorinated polypropylene, alkyl esters of polyacrylic acids (examples of the alkyl groups being methyl, ethyl, n-butyl, iso-butyl, n-hexyl and 2-ethylhexyl); copolymers of an alkylacrylate ester (the alkyl group thereof being the same as those listed above) and at least one monomer selected from the group consisting of acrylonitrile, vinyl chloride, vinylidene chloride, styrene and butadiene; polyvinyl chloride, copolymer of vinyl chloride and acrylonitrile; polyvinylidene chloride; copolymer of vinylidene chloride and acrylonitrile; polyvinyl acetate, polyvinyl alcohol, polyacrylonitrile, copolymer of acrylonitrile and styrene; copolymer of acrylonitrile, butadiene and styrene; polyalkylmethacrylate ester (the alkyl group being methyl, ethyl, n-propyl, n-butyl, iso-butyl, n-hexyl, cyclohexyl, 2-ethylhexyl or the like); copolymers of an alkylmethacrylate ester (the alkyl group being the same as defined above in connection with the polyalkylmethacrylate ester) and a monomer selected from the group consisting of acrylonitrile, vinyl chloride, vinylidene chloride, styrene, and butadiene; polystyrene, poly-alpha-methylstyrene, polyamides (6-nylon, 6,6-nylon or other nylons); methyl cellulose, ethyl cellulose, acetyl cellulose, polyvinylformal and polyvinylbutyral.

Moreover, if water-soluble or alkaline water-soluble organic polymers are used, the resultant composition can be developed with water or alkaline water. Examples of such polymers are addition polymers having carboxyl groups on the side chain thereof such as methacrylic copolymers, for instance, copolymer of methyl methacrylate and methacrylic acid, copolymer of ethyl methacrylate and methacrylic acid, copolymer of butyl methacrylate and methacrylic acid, copolymer of allyl methacrylate and methacrylic acid, copolymer of ethyl acrylate and methacrylic acid, copolymer of ethyl methacrylate, styrene and methacrylic acid; acrylic copolymers, for instance, copolymer of ethyl acrylate and acrylic acid, copolymer of butyl acrylate and acrylic acid and copolymer of ethyl acrylate, styrene and acrylic acid; as well as itaconic copolymers; crotonic copolymers; partially esterified maleic copolymers and acidic cellulose derivatives having carboxylic groups on the side chain thereof.

These high molecular polymers may be used alone as the binder and further they may be used in combination as the binder by mixing them in a proper ratio provided that they should have a good compatibility with each other to the extent that they do not cause separation throughout the manufacturing processes inclusive of preparation of a coating liquid, coating thereof and drying as already mentioned before.

The molecular weight of the polymers used as the binder may widely vary dependent upon the kinds thereof, however, it in general ranges from 5,000 to 2,000,000 and particularly preferred range thereof is 10,000 to 1,000,000.

A sensitizer which is optionally be used in the composition of the present invention may be selected so that the rate of photopolymerization is improved when the sensitizer is incorporated in the composition. Examples of such sensitizers include benzoin, benzoin methyl ether, benzoin ethyl ether, 9-fluorenone, 2-chloro-9-fluorenone, 2-methyl-9-fluorenone, 9-anthrone, 2-bromo-9-anthrone, 2-ethyl-9-anthrone, 9,10-anthraquinone, 2-ethyl-9,10-anthraquinone, 2-tert-butyl-9,10-anthraquinone, 2,6-dichloro-9,10-anthraquinone, xanthone, 2-methylxanthone, 2-methoxyxanthone, thioxanthone, benzil, dibenzalactone, p-(dimethylamino)phenylstyryl ketone, p-(dimethylamino)-phenyl-p-methylstyryl ketone, benzophenone, p-(dimethylamino)-benzophenone (or Michler's ketone), p-(diethylamino)-benzophenone and benzanthrone. Michler's ketone provides particularly preferred results among others.

In addition to the foregoing compounds, examples of the preferred sensitizers further include compounds represented by the following general formula (VI):

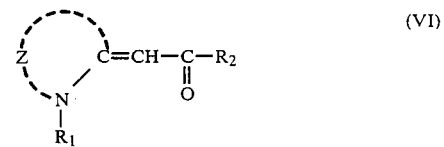

which are disclosed in U.S. Pat. No. 3,870,524.

In the above general formula (VI), $R_1$ represents an alkyl group such as methyl, ethyl or propyl group; or a substituted alkyl group such as 2-hydroxyethyl, 2-methoxyethyl, carboxymethyl or 2-carboxyethyl group.

$R_2$ in the general formula (VI) denotes an alkyl group such as methyl or ethyl group; or an aryl group such as phenyl, p-hydroxyphenyl, naphthyl or thienyl group.

Z in the general formula (VI) represents non-metallic atoms required to form a heterocyclic nucleus containing a nitrogen atoms and generally used in the cyanine dyes and examples thereof are heterocyclic rings derived from benzothiazoles such as benzothiazole, 5-chlorobenzothiazole and 6-chlorobenzothiazole; naphthothiazoles such as alpha-naphthothiazole and beta-naphthothiazole; benzoselenazoles such as benzoselenazole, 5-chlorobenzoselenazole and 6-methoxybenzoselenazole; naphthoselenazoles such as alpha-naphthoselenazole and beta-naphthoselenazole; benzoxazoles such as benzoxazole, 5-methylbenzoxazole and 5-phenylbenzoxazole; or naphthoxazoles such as alpha-naphthoxazole and beta-naphthoxazole.

Examples of the compounds represented by the general formula (VI) are those having chemical structures formed by combining the aforementioned Z, $R_1$ and $R_2$ and a variety of compounds are known in the art. Therefore, they may suitably be selected from those known ones and are used in the composition.

Furthermore, preferred sensitizers as used herein also include merocyanine dyes disclosed in Japanese Patent Unexamined Published Application Nos. 61-203443 and 61-203444; and ketocoumarin type compounds represented by the following general formula (VII):

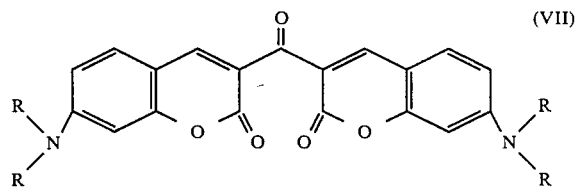

wherein R represents an alkyl group such as methyl or ethyl group.

In the photopolymerization composition according to the present invention, it is desirable to add a heat polymerization inhibitor so as to prevent undesired heat polymerization of the polymerizable compound having ethylenically unsaturated double bonds therein during the preparation of the composition of the present invention or during storage thereof. Examples of suitable heat polymerization inhibitors include hydroquinone, p-methoxyphenol, di-tert-butyl-p-cresol, pyrogallol, tert-butylcatechol, benzoquinone, cuprous chloride, phenothiazine, chloranil, naphthylamine, beta-naphthol, nitrobenzene and dinitrobenzene.

In addition, a dye or a pigment may be added to the composition of this invention for the purpose of coloring the composition and examples thereof are Methylene Blue, Crystal Violet, Rhodamine B, Fuchsine, Auramine, azo type dyes, anthraquinone type dyes, titanium oxide, carbon black, iron oxide, phthalocyanine type pigments and azo type pigments.

When the composition according to the present invention is used to form, for instance, a light-sensitive layer, it is in general applied to a substrate in the form of a coating solution. Therefore, it is desirable to enhance the adhesion between the composition and the substrate which is usually an aluminum plate which has been anodized (sulfuric acid or phosphoric acid) followed by silicate surface treatment. Examples of such an additive are negative-working diazo resins, such as $PF_6$ salt of the condensate of p-diazodiphenylamine and formaldehyde.

Further, a plasticizer may be added to the composition of the present invention according to need. Examples thereof are phthalates such as dimethylphthalate, diethylphthalate, dibutylphthalate, dihexylphthalate, dicyclohexylphthalate and ditridecylphthalate; glycol esters such as dimethyl glycol phthalate, ethyl phthalylethyl glycolate and butyl phthalylbutyl glycolate; phosphates such as tricresyl phosphate and triphenyl phosphate; and aliphatic dibasic acid esters such as diisobutyl adipate, dioctyl adipate, dibutyl sebacate and dibutyl maleate.

When the photopolymerizable composition according to the present invention is practically used, the foregoing components are first dissolved in a solvent to form a coating solution and then the resultant solution is applied to a proper substrate according to a known method. Preferred amount of each component are as follows, which is expressed as parts by weight per 100 parts by weight of the polymerizable compound having ethylenically unsaturated double bonds.

| Components | Preferred range (parts by wt.) | Particularly Preferred range (parts by wt.) |
| --- | --- | --- |
| Free Radical Generator of Formula (I) | 0.01 to 100 | 0.1 to 30 |
| Binder | 0 to 1,000 | 0 to 500 |
| Sensitizer | 0 to 100 | 0 to 20 |
| Heat Polymerization Inhibitor | 0 to 10 | 0 to 5 |
| Dye or Pigment | 0 to 50 | 0 to 20 |
| Plasticizer | 0 to 200 | 0 to 50 |

Examples of the solvents used for preparing the coating solution containing the light-sensitive composition of the present invention are ethylene dichloride, cyclohexanone, methyl ethyl ketone, methyl cellosolve acetate, methyl cellosolve, propylene glycol monomethyl ether, propylene glycol monomethyl ether acetate, methanol, monochlorobenzene, toluene and ethyl acetate. These solvents may be used alone or in combination.

The light-sensitive composition of the present invention is favorably used to obtain the light-sensitive layer of presensitized plates from which lithographic printing plates are to be prepared. In preparing presensitized plates, it is in general desirable to apply to a substrate the composition in an amount of 0.1 to 10.0 g/m$^2$ and particularly preferred amount thereof is 0.5 to 5.0 g/m$^2$ expressed as the weight of the solid content. Examples of the substrates suitable to form such presensitized plates include aluminum plates which are hydrophilized such as silicate treated aluminum plates, anodized aluminum plates, grained aluminum plates and silicate electrodeposited aluminum plates; plates of zinc; stainless steel plates; chromium-treated copper plates; hydrophilized plastic films or paper.

Moreover, the light-sensitive composition of the present invention may be used for producing proof plates for printing, films for overhead projector and films for intermediate print. In these cases, examples of suitable substrates for these plates or films are transparent films such as polyethylene terephthalate film and cellulose triacetate film and those plastic films, the surface of which is chemically or physically matted.

Further, the light-sensitive composition of the present invention may be used as films for photomasks. In this case, preferred substrates therefor include, for instance, polyethylene terephthalate films on which a layer of aluminum, aluminum alooy or chromium has been applied and polyethylene terephthalate films on which a colored layer has been formed.

Moreover, the composition of this invention may also be used as photoresists and in such case, a variety of substrates such as a copper plate, plates having a copper plating layer, a stainless steel plate and a glass plate may be used as the substrate.

As will be seen from the foregoing descriptions, the light-sensitive composition according to the present invention can effectively be used for manufacturing presensitized plates from which lithographic printing plates are to be prepared, proof plates for printing, films for overhead projector, films for intermediate print, films for photomasks, photoresists or the like since it has a high sensitivity which is resulted from the incorporation of a free radical generator of high sensitivity to photodecomposition. Moreover, if the light-sensitive composition of the present invention is used, a light-sensitive plate of high sensitivity can be produced even after it is stored under a high temperature condition.

The light-sensitive composition of the present invention will hereunder be described in more detail with reference to the following non-limitative working examples and the effects practically attained will also be discussed in comparison with comparative examples.

PREPARATION

Synthesis of 4-(p-N,N'-di-(ethoxycarbonylmethyl)aminophenyl)-2,6-di-(trichloromethyl)-s-triazine: exemplified compound (1)

A mixture of 4-(p-N,N'-di-(ethoxycarbonylmethyl)amino)-benzonitrile (4.35 g), trichloroacetonitrile (13 g) and aluminum tribromide (0.4 g) was prepared while stirring and hydrogen chloride gas was introduced into the mixture at an internal temperature of 5° C. for one hour. The internal temperature was raised up to room temperature followed by stirring for 20 hours. The reaction solution was extracted with methylene chloride, the extract was washed with water and then methylene chloride was distilled off under reduced pressure. The resultant residue was recrystallized from acetonitrile to obtain 3.5 g of yellow crystals. M.P.=109–111.

U.V. spectrum (in tetrahydrofuran).

$\lambda_{max}$: 386 nm (log $\epsilon$: 4.57).

I.R. spectrum (cm$^{-1}$): 1735, 1545, 1410, 1200.

EXAMPLE 1

A light-sensitive plate was prepared by applying the following coating solution to the surface of an aluminum plate, which had been grained with a nylon brush and then treated with an aqueous sodium silicate solution, using a rotary coating machine and then drying the coated layer at 100° C. for 3 minutes to form a light-sensitive layer on the aluminum plate.

In this connection, several light-sensitive plates were prepared utilizing the compounds represented by the general formula (I) according to the present invention and known compounds for the purpose of comparison. Compounds used are listed in the following Table I.

| Light-sensitive Solution | |
| --- | --- |
| Methyl Methacrylate-Methacrylic Acid (85/15: molar ratio) Copolymer (intrinsic viscosity = 0.166 at 30° C. in methyl ethyl ketone) | 62 g |
| Dipentaerythritol Hexaacrylate | 38 g |
| Free Radical Generator (see Table I) | 5 g |
| Ethyl Cellosolve | 650 ml |
| Methylene Chloride | 350 ml |

The exposure was carried out using a vacuum printing frame device i.e., a step-wedge (0.15 density difference; 0 to 15 density step numbers) was placed on a light-sensitive plate and then the latter was irradiated with light from a metal halide lamp (0.5 kW) through the step-wedge. After exposure to light, the plate was developed with a developer having the following formulation.

| Developer | |
| --- | --- |
| Trisodium Phosphate | 25 g |
| Sodium Dihydrogenphosphate | 5 g |
| Butyl Cellosolve | 70 g |
| Surfactant | 2 ml |
| Water | 1000 ml |

The exposure time required for obtaining the equal solid step number of the step-wedge in the image obtained after development was listed in Table I below. The shorter the exposure time, the higher the sensitivity of the light-sensitive plate.

TABLE 1

| Test No. | Compound Used | Exposure Time (seconds) |
| --- | --- | --- |
| 1 | Exemplified Compound (1) | 15 |
| 2 | Exemplified Compound (6) | 20 |
| 3 | Exemplified Compound (14) | 13 |
| 4 | Exemplified Compound (15) | 13 |
| 5* | 2,4,6-Tri(trichloromethyl)-s-triazine | 135 |
| 6* | 2-(p-methoxyphenyl)-4,6-bis-(trichloromethyl)-s-triazine | 85 |

*Comparative Tests

As seen from the results shown in Table I, the compositions according to the present invention which contain the compound represented by the general formula (I) present a high sensitivity compared with those containing known s-triazine compounds having trichloromethyl group (see Test Nos. 5 and 6). These results clearly show that the composition of the present invention surely provides the intended effects.

EXAMPLE 2

A light-sensitive printing plate I was produced by applying the following light-sensitive solution I to the surface of the aluminum plate obtained in Example 1.

| Light-sensitive Solution I | |
| --- | --- |
| Dipentaerythritol Hexaacrylate | 30 g |
| Allyl Methacrylate-Methacrylic Acid (85/15: molar ratio) Copolymer | 50 g |
| Free Radical Generator (exemplified compound (3)) | 2 g |
| Oil Blue #603 (manufactured and sold by ORIENT CHEMICAL INDUSTRIES LTD.) | 1 g |
| Ethylene Glycol Monomethyl Ether | 500 g |
| Methyl Alcohol | 150 g |
| Methyl Ethyl Ketone | 300 g |

For comparison, a light-sensitive solution II was prepared according to the same procedures as those for preparing the light-sensitive solution I except that the following compound was used instead of the exemplified compound (3) as the free radical generator and the resultant light-sensitive solution II was applied to the surface of the aluminum plate obtained in Example 1 to form a presensitized plate II.

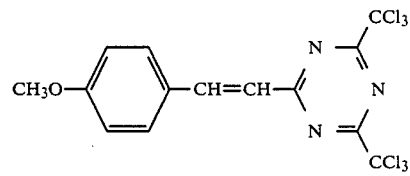

An incubation test was effected on some of these presensitized plates I and II (at 60° C. for 5 days). In this test, two kinds of samples (Viz., samples subjected to the incubation and those not subjected thereto) were exposed to light for a definite time and developed to compare the step numbers of the step-wedge observed in order to estimate the degree of decrease in the sensitivity resulted from the incubation. Results obtained are shown in the following Table II.

TABLE II

| Presensitized Plate | Step Number of before aging | Step-Wedge after aging |
| --- | --- | --- |
| I | 6 | 6 |
| II (Comp. Example) | 6 | 4 |

EXAMPLE 3

An aluminum plate of 0.30 mm in thickness was grained with a nylon brush and an aqueous suspension of pumice stone of 400 mesh and then was sufficiently washed with water. The aluminum plate was further etched by immersing it in 10% aqueous solution of sodium hydroxide at 70° C. for 60 seconds, washed with running water, followed by neutralizing and washing with 20% aqueous solution of $HNO_3$ and then washed with water. Thereafter, the aluminum plate was subjected to electrolytic roughening treatment in 1% aqueous solution of nitric acid and the quantity of anode time electricity of 160 coulomb/dm² utilizing an alternating waveform current of sine wave under a condition of $V_A = 12.7$ V. The surface roughness measured on the resulting aluminum plate was 0.6 micron (expressed as $R_a$). The plate was then desmutted by immersing it in 30% aqueous solution of $H_2SO_4$ at 50° C. for 2 minutes followed by anodization in 20% aqueous solution of $H_2SO_4$ at a current density of 2 $A/dm^2$ for 2 minutes so as to obtain an aluminum plate of 2.7 $g/m^2$ in thickness. Thereafter, the resulting aluminum plate was immersed in 2.5% aqueous solution of sodium silicate at 70° C. for one minute, washed with water and dried.

A light-sensitive plate was produced by applying a light-sensitive solution having the following composition onto the aluminum plate thus treated so that the coated amount thereof was 2 $g/m^2$ after drying and then was dried at 100° C. for 2 minutes. The kind of the photopolymerization initiator used and the amount thereof are shown in the following Table III.

| Composition of the Light-sensitive Solution | |
|---|---|
| Trimethylolpropane Triacrylate | 1 g |
| Allyl Methacrylate-Methacrylic Acid (85/15: molar ratio) Copolymer | 3 g |
| Photopolymerization Initiator (see Table III) | 0.1 g |
| $PF_6$ Salt of the Condensate between p-Diazodiphenylamine and Formaldehyde | 0.15 g |
| Oil Blue #603 (manufactured and sold by ORIENT CHEMICAL INDUSTRIES LTD.) | 0.05 g |
| Behenic Acid | 0.05 g |
| Behenic Acid Amide | 0.05 g |
| MEGAFAC F-177 (fluorine surfactant manufactured and sold by DAINIPPON INK AND CHEMICALS, INC.) | 0.05 g |
| Dipicolinic Acid | 0.05 g |
| Ethylene Glycol Monomethyl Ether | 25 g |
| Methanol | 7.5 g |
| Methyl Ethyl Ketone | 15 g |

The resultant light-sensitive plate was left to stand at 60° C. for 5 days. The surface of the light-sensitive plate thus obtained was observed by a microscope and the surface of the plate was rubbed with a filter paper followed by the extraction with methanol to carry out UV measurement and thus it was confirmed if the photopolymerization initiator moves to the surface of the light-sensitive layer to cause deposition or further optionally causes aggregation which leads to the crystallization on the surface of the light-sensitive layer (hereinafter referred to as "crystallization"). Results observed are listed in Table III.

According to the analysis of the crystallization of the coparative samples 3-1 to 3-4, it was evidenced that the portions were composed of each photopolymerization initiator.

Moreover, samples 3-1 to 3-13 of the light-sensitive plates obtained using the composition according to the present invention were left to stand at 25° C. (laboratory temperature) and 60° C. for 5 days respectively.

The light-sensitive layer of the light-sensitive plate thus obtained was superposed with Fuji PS Step Guide (manufactured and sold by Fuji Photo Film Co., Ltd.), i.e., the gray scale which presents discontinuous change in the transmittance at an interval of $\Delta D=0.15$, in close contact with the plate and the layer was exposed to light from a high pressure mercury lamp of 10 A at a distance of 70 cm.

The development thereof was effected with a developer disclosed in U.S. Pat. No. 4,186,006 and having the following composition to remove non-exposed portions:

| | |
|---|---|
| Sodium Sulfite | 3 g |
| Benzyl Alcohol | 30 g |
| Triethanol Amine | 20 g |
| Monoethanol Amine | 5 g |
| PELEX NBL (sodium tert-butylnaphthalene sulfonate: manufactured and sold by KAO ATLAS Corporation) | 30 g |
| Water | 1000 g |

Samples were left to stand at 25° C. (laboratory temperature) and 60° C. for 5 days and exposed to light to determine the exposure time at which the third step of the gray scale became completely solid.

As seen from the results shown in Table III, there was no difference in the exposure time, at which the third step of the step guide became completely solid, observed on the samples 3-1 to 3-13 produced from the composition according to the present invention which did not cause the crystal deposition of the photopolymerization initiators. On the other hand, the results observed on the coparative samples 3-1 to 3-4 clearly show that a longer exposure time is required to obtain the same result in all cases where the samples were left to stand at 60° C.

TABLE III

| Photopolymerization Initiator | Crystallization | Exposure Time* 25° C. | Exposure Time* 60° C. |
|---|---|---|---|
| Sample No. | | | |
| 3-1 | Exemplified Comp. (1) | not observed | 50 | 50 |
| 3-2 | Exemplified Comp. (2) | " | 90 | 90 |
| 3-3 | Exemplified Comp. (3) | " | 50 | 50 |
| 3-4 | Exemplified Comp. (4) | " | 90 | 90 |
| 3-5 | Exemplified Comp. (5) | " | 120 | 120 |
| 3-6 | Exemplified Comp. (6) | " | 120 | 120 |
| 3-7 | Exemplified Comp. (7) | " | 400 | 400 |
| 3-8 | Exemplified Comp. (9) | " | 200 | 200 |
| 3-9 | Exemplified Comp. (10) | " | 70 | 70 |
| 3-10 | Exemplified Comp. (14) | " | 30 | 30 |
| 3-11 | Exemplified Comp. (15) | " | 30 | 30 |
| 3-12 | Exemplified Comp. (20) | " | 30 | 30 |
| 3-13 | Exemplified Comp. (21) | " | 30 | 30 |
| Comp. Sample No. | | | | |
| 3-1 | Initiator A | observed | 50 | 90 |
| 3-2 | Initiator B | " | 50 | 50 |
| 3-3 | Initiator C | " | 140 | 420 |
| 3-4 | Initiator D | " | 50 | 50 |

*The exposure time means one at which the third step of the step guide becomes completely solid.

Initiator A:

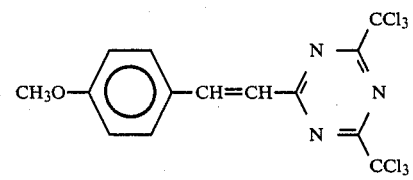

Initiator B:

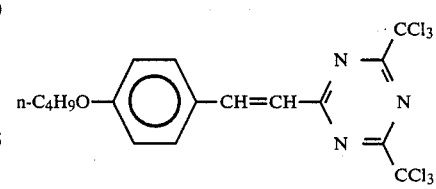

Initiator C:

TABLE III-continued

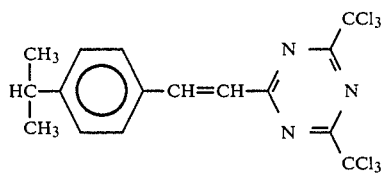

Initiator D:

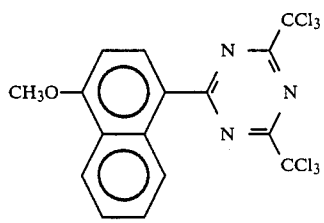

What is claimed is:

1. A light-sensitive composition comprises at least one light-sensitive s-triazine compound represented by the following general formula (I) and at leat one compound having at least one ethylenically unsaturated double bond and capable of causing addition polymerization:

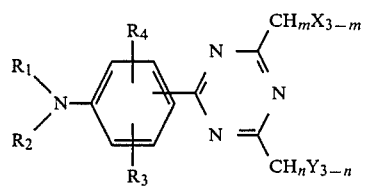 [I]

wherein $R_1$ and $R_2$ may or may not be identical with each other and represent hydrogen atom, a substituted or unsubstituted alkyl group, a substituted or unsubstituted aryl group, or a group represented by the following general formula (II) or (III):

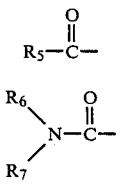 [II]

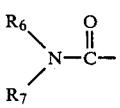 [III]

(in the general formulas (II) and (III), $R_5$ stands for a substituted or unsubstituted alkyl group, or a substituted or unsubstituted aryl group; and $R_6$ and $R_7$ may or may not be identical with each other and represent hydrogen atom, a substituted or unsubstituted alkyl group or a substituted or unsubstituted aryl group), provided that $R_1$ and $R_2$ may form a heterocyclic ring consisting of non-metallic atoms together with the nitrogen atom to which they are bonded; $R_3$ and $R_4$ represent hydrogen atom, a halogen atom, an alkyl group or an alkoxyl group; X and Y may or may not be identical with each other and represent chlorine atom or bromine atom; and m and n are an integer of 0, 1 or 2.

2. The light-sensitive composition as set forth in claim 1 wherein the substituted or unsubstituted alkyl group represented by $R_1$ to $R_7$ has 1 to 6 carbon atoms and the substituted or unsubstituted aryl group represented by $R_1$ to $R_7$ has 6 to 14 carbon atoms.

3. The light-sensitive composition as set forth in claim 2 wherein the substituent of the substituted alkyl or aryl group appearing in $R_1$ and $R_2$ is selected from the group consisting of aryl groups in the case of substituted alkyl groups, alkyl groups in the case of substituted aryl groups, halogen atoms, alkoxyl groups, carboxyl groups, carboalkoxy groups, carboaryloxy groups, cyano groups, acyl groups, nitro groups, dialkylamino groups, and groups derived from sulfonyl derivatives represented by the general formula: $-SO_2-Z$, $-SO_3-Z$ or $-SO_2-NH-Z$ wherein Z represents a hydrogen atom, an alkyl group or an aryl group; and the substituent of the substituted alkyl or aryl group appearing in $R_5$ to $R_7$ is selected from the group consisting of aryl groups in the case of substituted alkyl groups, alkyl groups in the case of substituted aryl groups, halogen atoms, cyano groups, acyl groups, nitro groups, dialkylamino groups, and groups derived from sulfonyl derivatives represented by the general formula: $-SO_2-Z$, $-SO_3-Z$ or $-SO_2-NH-Z$ wherein Z represents a hydrogen atom, an alkyl group or an aryl group.

4. The light-sensitive composition as set forth in claim 2 wherein the substituent of the substituted alkyl or aryl group represented by $R_1$ and $R_2$ is a member selected from the group consisting of halogen atoms, carboxyl groups, carboalkoxy groups, cyano groups, acyl groups and groups derived from sulfonyl derivatives and the substituent of the substituted alkyl or aryl group of $R_5$ is a member selected from the group consisting of dialkylamino groups.

5. The light-sensitive composition as set forth in claim 1 wherein $R_1$ and $R_2$ form a heterocyclic ring selected from the group consisting of groups (D) to (H):

 (D)

 (E)

 (F)

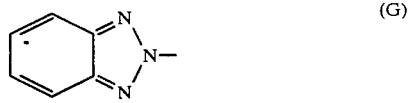 (G)

 (H)

6. The light-sensitive composition as set forth in claim 1 wherein the s-triazine compound is selected from the group consisting of those represented by the general formula (I) in which $R_1$ and $R_2$ represent hydrogen atom, a carboalkoxymethyl group, chloromethyl group, chloroethyl group or cyanoethyl group, provided that at least one of them represents a group other than hydrogen atom or $R_1$ and $R_2$ form a ring represented by the following formula:

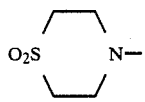

and $R_3$ and $R_4$ represent hydrogen atom, a halogen atom or an alkyl group.

7. The light-sensitive composition as set forth in claim 1 wherein the compound having at least one ethylenically unsaturated double bond is selected from the group consisting of unsaturated carboxylic acids and salts thereof; esters of unsaturated carboxylic acids and aliphatic polyol compounds; and amides of unsaturated carboxylic acids and aliphatic polyamine compounds.

8. The light-sensitive composition as set forth in claim 7 wherein the substituted or unsubstituted alkyl group represented by $R_1$ to $R_7$ has 1 to 6 carbon atoms and the substituted or unsubstituted aryl group represented by $R_1$ to $R_7$ has 6 to 14 carbon atoms.

9. The light-sensitive composition as set forth in claim 8 wherein the composition further comprises at least one binder.

10. The light-sensitive composition as set forth in claim 9 the binder is a linear organic high molecular polymer having a molecular weight of 5,000 to 2,000,000.

11. The light-sensitive composition as set forth in claim 9 wherein the composition further comprises at least one sensitizer.

12. The light-sensitive composition as set forth in claim 11 wherein the sensitizer is selected from the group consisting of Michler's ketone and compounds represented by the following general formula (VI):

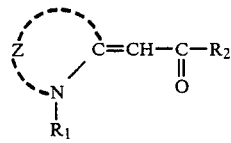

wherein $R_1$ represents a substituted or unsubstituted alkyl group, $R_2$ represents an alkyl group or an aryl group and Z represents non-metallic atoms required to form a heterocyclic group derived from benzothiazoles, naphthothiazoles, benzoselenazoles, naphthoselenazoles, benzoxazoles or naphthoxazoles.

13. The light-sensitive composition as set forth in claim 11 wherein the composition comprises at least one heat polymerization inhibitor.

14. The light-sensitive composition as set forth in claim 13 wherein the heat polymerization inhibitor is selected from the group consisting of hydroquinone, p-methoxyphenol, di-tert-butyl-p-cresol, pyrogallol, tert-butylcatechol, benzoquinone, cuprous chloride, phenothiazine, chloranil, naphthylamine, beta-naphthol, nitrobenzene and dinitrobenzene.

15. The light-sensitive composition as set forth in claim 13 wherein the composition comprises a dye or a pigment.

16. The light-sensitive composition as set forth in claim 15 wherein the composition comprises a plasticizer.

17. The light-sensitive composition as set forth in claim 1 wherein the light-sensitive composition comprises 0.01 to 100 parts by weight of the compound represented by the general formula (I), 0 to 1,000 parts by weight of the binder, 0 to 100 parts by weight of the sensitizer, 0 to 10 parts by weight of the heat polymerization inhibitor, 0 to 50 parts by weight of the dye or the pigment and 0 to 200 parts by weight of the plasticizer on the basis of 100 parts by weight of the compound having at least one ethylenically unsaturated double bond.

18. The light-sensitive composition as set forth in claim 17 wherein the light-sensitive composition comprises 0.1 to 30 parts by weight of the compound represented by the general formula (I), 0 to 500 parts by weight of the binder, 0 to 20 parts by weight of the sensitizer, 0 to 5 parts by weight of the heat polymerization inhibitor, 0 to 20 parts by weight of the dye or the pigment and 0 to 50 parts by weight of the plasticizer on the basis of 100 parts by weight of the compound having at least one ethylenically unsaturated double bond.

* * * * *